(12) United States Patent
Furukubo

(10) Patent No.: US 11,757,249 B2
(45) Date of Patent: Sep. 12, 2023

(54) SUBSTRATE FOR MOUNTING A LIGHT-EMITTING ELEMENT AND ARRAY SUBSTRATE, AND LIGHT-EMITTING DEVICE

(71) Applicant: KYOCERA Corporation, Kyoto (JP)

(72) Inventor: Youji Furukubo, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 378 days.

(21) Appl. No.: 16/766,037

(22) PCT Filed: Nov. 19, 2018

(86) PCT No.: PCT/JP2018/042632
§ 371 (c)(1),
(2) Date: May 21, 2020

(87) PCT Pub. No.: WO2019/102956
PCT Pub. Date: May 31, 2019

(65) Prior Publication Data
US 2020/0366052 A1   Nov. 19, 2020

(30) Foreign Application Priority Data

Nov. 24, 2017 (JP) .................................. 2017-225960
Apr. 10, 2018 (JP) .................................. 2018-075456

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *H01S 5/02208* | (2021.01) |
| *H01L 33/20* | (2010.01) |
| *H01L 33/48* | (2010.01) |
| *H01S 5/02218* | (2021.01) |

(52) U.S. Cl.
CPC .......... *H01S 5/02208* (2013.01); *H01L 33/20* (2013.01); *H01L 33/486* (2013.01); *H01S 5/02218* (2021.01)

(58) Field of Classification Search
CPC ......... H01S 5/023–02326; H01L 33/20; H01L 33/642
See application file for complete search history.

(56) References Cited

U.S. PATENT DOCUMENTS 6,259,713 B1 * 7/2001 Hwu .................. G02B 19/0028
372/50.1
7,158,549 B2   1/2007 Ayliffe
(Continued)

FOREIGN PATENT DOCUMENTS

| EP | 3447864 A1 | 2/2019 |
|---|---|---|
| EP | 3687009 A1 | 7/2020 |

(Continued)

*Primary Examiner* — Ismail A Muse
(74) *Attorney, Agent, or Firm* — Volpe Koenig

(57) ABSTRACT

A substrate for mounting a light-emitting element includes a substrate with a plate shape and a base that protrudes from a front surface of the substrate, wherein the base has a mounting part for mounting a light-emitting element on a top surface thereof and composes a sloping surface that slopes with respect to the front surface and the substrate and the base are integrally formed of a ceramic.

12 Claims, 12 Drawing Sheets

(56) References Cited

U.S. PATENT DOCUMENTS

| | | | | |
|---|---|---|---|---|
| 2002/0121863 A1* | 9/2002 | Morishita | H01S 5/0234 | 315/169.3 |
| 2007/0195524 A1* | 8/2007 | Seo | H01L 25/0753 | 362/228 |
| 2007/0217476 A1* | 9/2007 | Yoshikawa | H01L 24/32 | 372/66 |
| 2007/0257272 A1* | 11/2007 | Hutchins | F21V 7/04 | 257/E33.072 |
| 2011/0062863 A1* | 3/2011 | Hsiao | H10K 59/805 | 313/505 |
| 2011/0149601 A1* | 6/2011 | Jang | H01L 25/0753 | 362/612 |
| 2011/0303929 A1* | 12/2011 | Strickler | H01L 33/52 | 257/E33.056 |
| 2013/0277806 A1* | 10/2013 | Hipwell, Jr. | H01S 5/0236 | 438/26 |
| 2015/0043212 A1* | 2/2015 | Coffey | F21K 9/23 | 362/294 |
| 2015/0204507 A1* | 7/2015 | Kang | F21K 9/238 | 362/293 |
| 2015/0236232 A1* | 8/2015 | Reeves | H01L 33/54 | 257/99 |
| 2015/0377421 A1* | 12/2015 | Chen | F21K 9/232 | 362/249.02 |
| 2016/0054504 A1* | 2/2016 | Chu | G02B 6/0068 | 362/610 |
| 2017/0033529 A1* | 2/2017 | Furuya | G02B 7/027 | |
| 2017/0051883 A1* | 2/2017 | Raring | H01S 5/02224 | |
| 2017/0051884 A1 | 2/2017 | Raring et al. | | |
| 2017/0214215 A1 | 7/2017 | Suzuki et al. | | |
| 2018/0145478 A1* | 5/2018 | Sakai | H01S 5/0235 | |
| 2018/0316160 A1 | 11/2018 | Raring et al. | | |
| 2019/0131765 A1* | 5/2019 | Furukubo | H01S 5/0207 | |
| 2019/0363221 A1* | 11/2019 | Hu | H01L 33/36 | |
| 2021/0091263 A1* | 3/2021 | Herrmann | F21K 9/90 | |

FOREIGN PATENT DOCUMENTS

| | | |
|---|---|---|
| JP | 07-038208 A | 2/1995 |
| JP | 2005-223083 A | 8/2005 |
| JP | 2006-196505 A | 7/2006 |
| JP | 2014-116514 A | 6/2014 |
| WO | 2005/054921 A1 | 6/2005 |
| WO | 2017/031446 A1 | 2/2017 |
| WO | 2017/183638 A1 | 10/2017 |

* cited by examiner

So PART

US 11,757,249 B2

SUBSTRATE FOR MOUNTING A LIGHT-EMITTING ELEMENT AND ARRAY SUBSTRATE, AND LIGHT-EMITTING DEVICE

CROSS-REFERENCE TO RELATED APPLICATIONS

This application is a national stage application of International Application No. PCT/JP2018/042632, filed on Nov. 19, 2018, which designates the United States, the entire contents of which are herein incorporated by reference, and which is based upon and claims the benefit of priority to Japanese Patent Application No. 2017-225960, filed on Nov. 24, 2017, and Japanese Patent Application No. 2018-075456, filed on Oct. 4, 2018, the entire contents of which are herein incorporated by reference.

FIELD

Disclosed embodiments relate to a substrate for mounting a light-emitting element and an array substrate, and a light-emitting device.

BACKGROUND

A package for mounting a light-emitting element to mount a light-emitting element that emits laser light is disclosed conventionally. A package for mounting a light-emitting element is structured to have a metal base that emits heat to an outside thereof and a sub-mount made of a ceramic that is firmly fixed by a bonding material such as a solder on the metal base and to mount a light-emitting element on the sub-mount (see, for example, Patent Literature 1).

CITATION LIST

Patent Literature

Patent Literature 1: Japanese Patent Application Publication No. 2014-116514

SUMMARY

A substrate for mounting a light-emitting element according to an aspect of an embodiment includes a substrate with a plate shape, and one or more bases that protrude from a front surface of the substrate and have a mounting surface where a light-emitting element is mounted, wherein the mounting surface is provided with a height from the front surface that differs in a direction of two opposing end surfaces of the substrate and composes a sloping surface that slopes with respect to the front surface, and the substrate and the base are integrally formed of a ceramic.

An array substrate according to an aspect of an embodiment is provided where a plurality of substrates for mounting a light-emitting element as described above are joined.

A light-emitting device according to an embodiment has a light-emitting element on a mounting part of a substrate for mounting a light-emitting element as described above or a mounting part of an array substrate as described above.

DESCRIPTION OF EMBODIMENTS

An aspect of an embodiment is to provide a substrate for mounting a light-emitting element that is capable of preventing reflected light from being readily incident on a light-emitting surface of a light-emitting element even after light that is emitted from the light-emitting element impinges on a target object, and an array substrate where a plurality thereof are joined.

Hereinafter, embodiments of a substrate for mounting a light-emitting element and an array substrate as disclosed in the present application will be explained with reference to the accompanying drawings. Herein, for a light-emitting element, it is possible to provide a laser diode (Laser Diode), a light-emitting diode (LED: Light Emitting Diode), and the like. Each embodiment as illustrated below is useful for, in particular, a laser diode.

Figure 1:
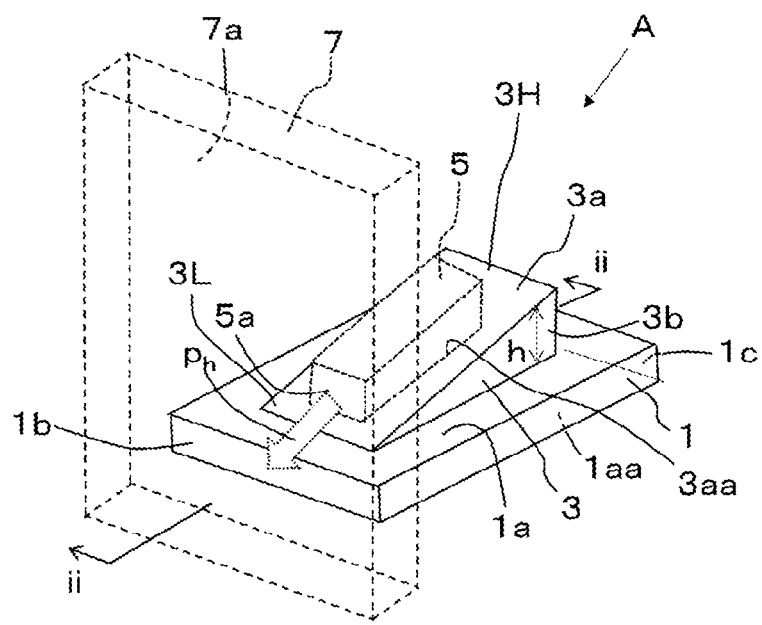
FIG. 1 is a schematic diagram that illustrates an example of a utilization form of a substrate for mounting a light-emitting element according to an embodiment.
Figure 2:
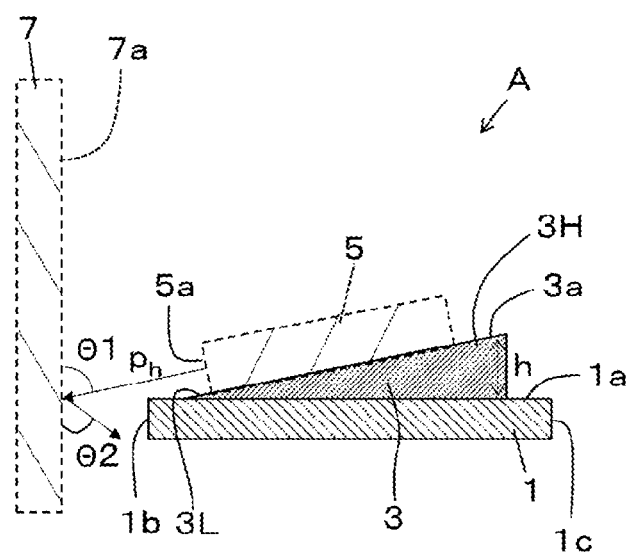
FIG. 2 is a cross-sectional view along line ii-ii in FIG. 1.

FIG. 1 is a schematic diagram that illustrates an example of a utilization form of a substrate for mounting a light-emitting element according to an embodiment. FIG. 1 illustrates a substrate for mounting a light-emitting element A where a light-emitting element 5 is packaged. Hereinafter, the substrate for mounting a light-emitting element A where the light-emitting element 5 is packaged may be represented as a light-emitting device. Furthermore, FIG. 1 illustrates a state where a base material 7 that has a surface 7a that reflects light $p_h$ is placed. FIG. 2 is a cross-sectional view along line ii-ii in FIG. 1. For explanatory convenience, FIG. 1 illustrates the light-emitting element 5 and a base material that has the surface 7a that reflects light $p_h$ (that will be represented as the base material 7 below) in an imaginary form. Hence, for the light-emitting element 5 and the base material 7, shapes thereof are indicated by broken lines.

As illustrated in FIG. 1 and the like, the substrate for mounting a light-emitting element A according to an embodiment includes a substrate 1 with a plate shape and a base 3 that protrudes upward from a front surface 1a of the substrate 1. Furthermore, a mounting part 3aa is provided on a top surface 3a of the base 3. The light-emitting element 5 is mounted on such a mounting part 3aa. In such a case, a shape of the light-emitting element 5 is assumed to be, for example, a columnar body with a hexahedral shape or a circularly cylindrical shape. The base material 7 is arranged at a position where a light-emitting surface 5a of the light-emitting element 5 is oriented. The base material 7 has a property to reflect light $p_h$ that is emitted from the light-emitting element 5, after impinging thereon. Herein, a height h of the top surface 3a of the base 3 that composes the substrate for mounting a light-emitting element A as illustrated in FIG. 1, from the front surface 1a, differs in a direction of two opposing end surfaces 1b, 1c of the substrate 1. In other words, the top surface 3a slopes with respect to the front surface 1a of the substrate 1. In FIGS. 1 and 2, a part with the height h that is lower of the base 3 is provided as a lower position part 3L and a part with height h that is higher is represented as a higher position part 3H. Hereinafter, the top surface 3a that slopes may be represented as a sloping surface 3a. The lower position part 3L of the base 3 is a site on a side of the end surface 1b in a case where the top surface 3a of the base 3 is trisected within a range of a length from a side of the end surface 1b to a side of the end surface 1c of the substrate 1. On the other hand, the higher position part 3H is a site on a side of the end surface 1c in a case where the top surface 3a of the base 3 is trisected within a range of a length from a side of the end surface 1b to a side of the end surface 1c of the substrate 1. Additionally, the substrate for mounting a light-emitting element A as illustrated in FIGS. 1 and 2 is arranged in such a manner that a height of the sloping surface 3a on a side of the light-emitting surface 5a of the light-emitting element 5 is lower and an opposite side of the light-emitting surface 5a is higher, and otherwise, an orientation of the base 3 may be arranged in an opposite direction in such a manner that a side of the higher position part 3H of the base 3 is a side of the light-emitting surface 5a of the light-emitting element 5.

In a case where the light-emitting element 5 is packaged on the mounting part 3aa of the sloping surface 3a, the light-emitting surface 5a of the light-emitting element 5 is a surface that is perpendicular to the sloping surface 3a. Accordingly, light $p_h$ that is emitted from the light-emitting surface 5a is emitted in a direction that is substantially parallel to the sloping surface 3a. In a case where the base material 7 is arranged in a direction that is perpendicular to the substrate 1 that composes the substrate for mounting a light-emitting element A, light $p_h$ that is emitted from the light-emitting surface 5a impinges on the surface 7a of the base material 7 not at a right angle but at an angle θ1 that is less than such a right angle. As illustrated in FIG. 2, light $p_h$ that impinges on and is reflected from the surface 7a of the base material 7 is reflected at an angle θ2 that is similar to the angle θ1 where the light $p_h$ impinges on the surface 7a of the base material 7. As a result, even if light $p_h$ that is emitted from the light-emitting element 5 impinges on and is reflected from the surface 7a of the base material 7, it is possible to decrease a rate of reflecting and returning in a direction of the light-emitting surface 5a of the light-emitting element 5. That is, according to the substrate for mounting a light-emitting element A, it is possible to decrease a rate of incidence of reflected light $p_h$ on the light-emitting surface 5a of the light-emitting element 5. Hence, according to the substrate for mounting a light-emitting element A, it is possible to prevent reduction of an output of the light-emitting element 5. Furthermore, it is possible to attain extension of a life of the light-emitting element 5.

Furthermore, in such a substrate for mounting a light-emitting element A, the substrate 1 and the base 3 are integrally formed of a ceramic. The substrate 1 and the base 3 are composed of a sintered body of a ceramic particle(s). That is, in the substrate for mounting a light-emitting element A, an interface is not provided between the base 3 where the light-emitting element 5 is mounted and the substrate 1 that has a function of releasing heat to an outside thereof. As an interface is present between the base 3 and the substrate 1, a possibility of causing a large heat resistance is increased. The same also applies to a case where a heterogeneous material is included in such an interface. Thereby, it is possible to decrease a heat resistance between the substrate 1 and the base 3. As a result, it is possible to transfer heat from the base 3 to the substrate 1 efficiently. Therefore, it is possible to realize the substrate for mounting a light-emitting element A with a high heat releasing property.

It is possible to apply a variety of ceramics to the substrate 1 and the base 3. In such a case, aluminum nitride is preferable, in particular, in that a thermal conductivity is high and a thermal expansion rate is close to that of the light-emitting element 5 (for example, a laser diode).

Additionally, for the substrate for mounting a light-emitting element A, electrical conductors are provided on the front surface 1a, a back surface 1aa, and an inside of the substrate 1 and a mounting surface 3a, a side surface(s), and an inside of the base 3 according to need, although illustration thereof is not provided in FIG. 1 and FIG. 2. Hereinafter, electrical conductors are also provided to substrates for mounting a light-emitting element B to S and an array substrate T as illustrated in FIG. 3 to FIG. 24 similarly. For a material of an electrical conductor, in a case where aluminum nitride is applied to the substrate 1 and the base 3, one of tungsten (W), molybdenum (Mo), and an alloy thereof or a metallic material where copper or the like is compounded is suitable in that simultaneous firing is possible.

Figure 3:
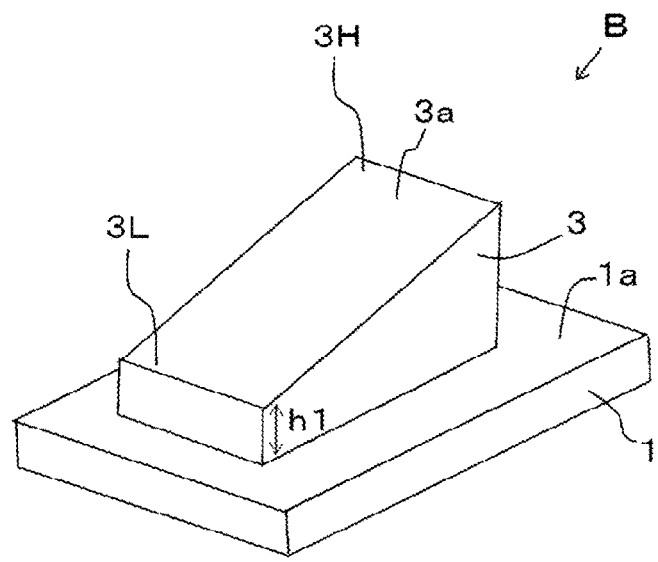
FIG. 3 is a perspective view that schematically illustrates another aspect of a substrate for mounting a light-emitting element.

FIG. 3 is a perspective view that schematically illustrates another aspect of a substrate for mounting a light-emitting element. In a substrate for mounting a light-emitting element B as illustrated in FIG. 3, the lower position part 3L has a height that is greater than 0 from the front surface 1a. A site with the height h from the front surface 1a of the substrate 1 to the top surface (sloping surface) 3a that is lower (the lower position part 3L) is structured to have a predetermined height h1 from the front surface 1a of the substrate 1. Such a case also produces an effect similar to that of the substrate for mounting a light-emitting element A as illustrated in FIGS. 1 and 2. A volume of the base 3 in the substrate for mounting a light-emitting element B is greater than that of the substrate for mounting a light-emitting element A, so that it is possible to further improve a heat releasing property from the light-emitting element 5. Herein, the lower position part 3L with a height that is greater than 0 from the front surface 1a means a state where a height of the lower position part 3L from the front surface 1a is 0.1 mm or greater. An upper limit of a height of the lower position part 3L from the front surface 1a is ½ of a height of the higher position part 3H from the front surface 1a as a rough indication. In such a case, an edge 3b of a part with the height h from the front surface 1a of the substrate 1 to the top surface 3a that is lower (the lower position part 3L) may be arranged so as to be along the end surface 1b of the substrate 1.

Figure 4:
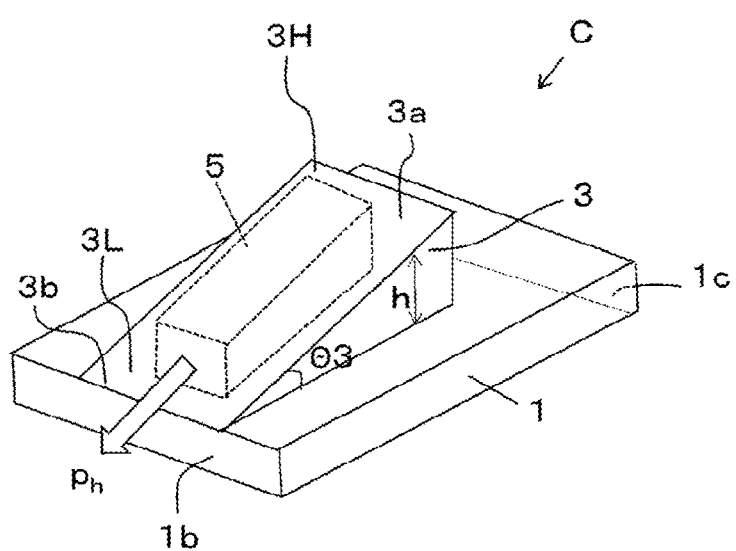
FIG. 4 is a perspective view that schematically illustrates another aspect of a substrate for mounting a light-emitting element.
Figure 5:
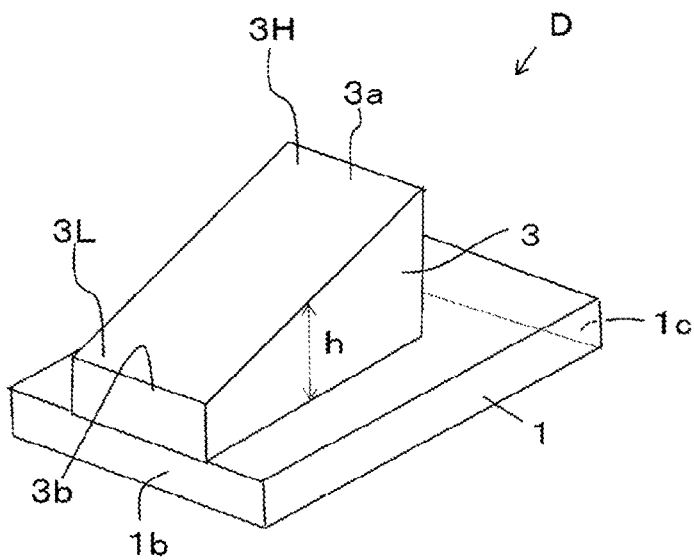
FIG. 5 is a perspective view that schematically illustrates another aspect of a substrate for mounting a light-emitting element.

FIG. 4 and FIG. 5 are perspective views that schematically illustrate other aspects of a substrate for mounting a light-emitting element. In a substrate for mounting a light-emitting element C as illustrated in FIG. 4 and a substrate for mounting a light-emitting element D as illustrated in FIG. 5, the edge 3b of a part with the height h from the front surface 1a of the substrate 1 to the top surface 3a that is lower (the lower position part 3L) is close to the end surface 1b of the substrate 1. In such a case, arrangement may be provided in such a manner that the edge 3b of the lower position part 3L and the end surface 1b of the substrate 1 are correspondent. According to such a configuration, it is possible to prevent light $p_h$ that is emitted from the light-emitting element 5 from impinging on and being reflected from the front surface 1a on a front side of the base 3 (a side of the base material 7). Thereby, it is possible to further improve a directivity of light $p_h$ that is emitted from the light-emitting element 5. Additionally, in a case where the light-emitting surface 5a of the light-emitting element 5 is arranged on a side of the higher position part 3H, it is sufficient to arrange the higher position part 3H along the end surface 1b.

As compared with the substrate for mounting a light-emitting element D as illustrated in FIG. 5, it is possible for the substrate for mounting a light-emitting element C as illustrated in FIG. 4 to decrease a height from the front surface 1a of the substrate 1 to a top surface of the light-emitting element 5 when the light-emitting element 5 is mounted on the sloping surface 3a, so that it is possible to attain reduction of a height of a light-emitting device. Furthermore, in a case of the substrate for mounting a light-emitting element C, it is possible to increase an angle θ3 of the sloping surface 3a of the base 3 with respect to the front surface 1a of the substrate 1. Thus, it is readily applied even in a case where a reflection performance of the surface 7a of the base material 7 is high. On the other hand, a volume of the base 3 in the substrate for mounting a light-emitting element D as illustrated in FIG. 5 is large, so that it is possible to improve a heat releasing property from the light-emitting element 5, similarly to the substrate for mounting a light-emitting element B.

Figure 6:
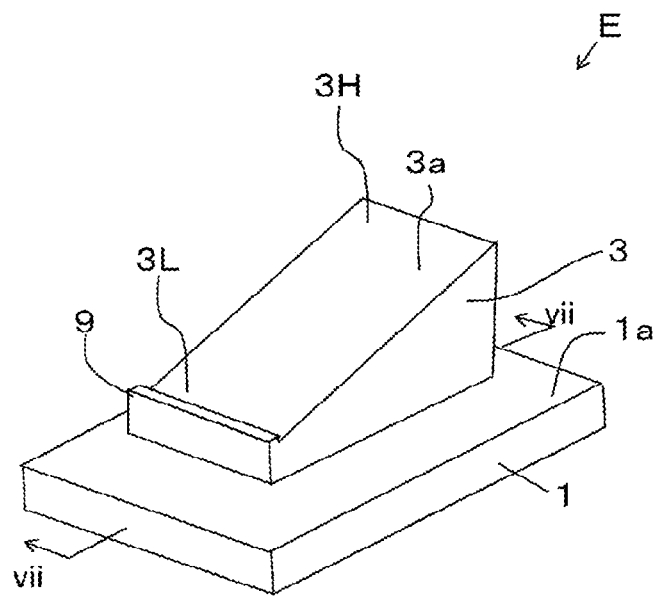
FIG. 6 is a perspective view that schematically illustrates another aspect of a substrate for mounting a light-emitting element.
Figure 7:
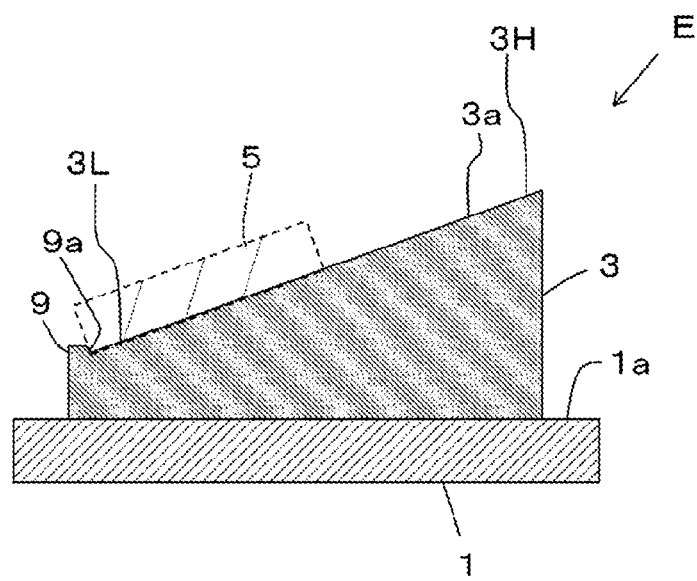
FIG. 7 is a cross-sectional view along line vii-vii in FIG. 6.

FIG. 6 is a perspective view that schematically illustrates another aspect of a substrate for mounting a light-emitting element. FIG. 7 is a cross-sectional view along line vii-vii in FIG. 6. A substrate for mounting a light-emitting element E as illustrated in FIG. 6 and FIG. 7 has a dam part 9 on the base 3. The dam part 9 is formed in a state where it protrudes from the sloping surface 3a of the base 3. As the dam part 9 is formed on the lower position part 3L of the base 3, it is possible to provide a state where the light-emitting element 5 contacts an end of the sloping surface 3a as illustrated in FIG. 7. Hence, it is possible to fix the light-emitting element 5 in a stable state thereof when it is placed on the sloping surface 3a. In such a case, a side surface 9a of the dam part 9 on a side of the sloping surface 3a (that may be represented as a striking surface 9a) is preferably provided at a right angle with respect to the sloping surface 3a. As the striking surface 9a is provided at a right angle with respect to the sloping surface 3a, a surface area of the light-emitting element 5 that contacts the striking surface 9a is increased, so that heat readily transfers from the light-emitting element 5 to the base 3 and it is possible to improve a heat releasing property. Additionally, the striking surface 9a may be provided at a right angle with respect to the front surface 1a of the substrate 1. In such a case, the striking surface 9a is provided in a state where it linearly contacts the light-emitting surface 5a of the light-emitting element 5, so that it is possible to decrease a temperature distribution on the light-emitting surface 5a of the light-emitting element 5.

Figure 8:
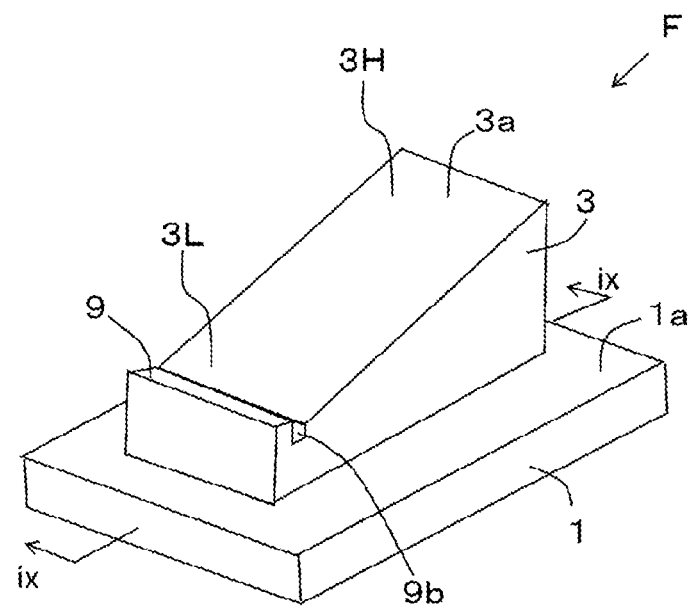
FIG. 8 is a perspective view that schematically illustrates another aspect of a substrate for mounting a light-emitting element.
Figure 9:
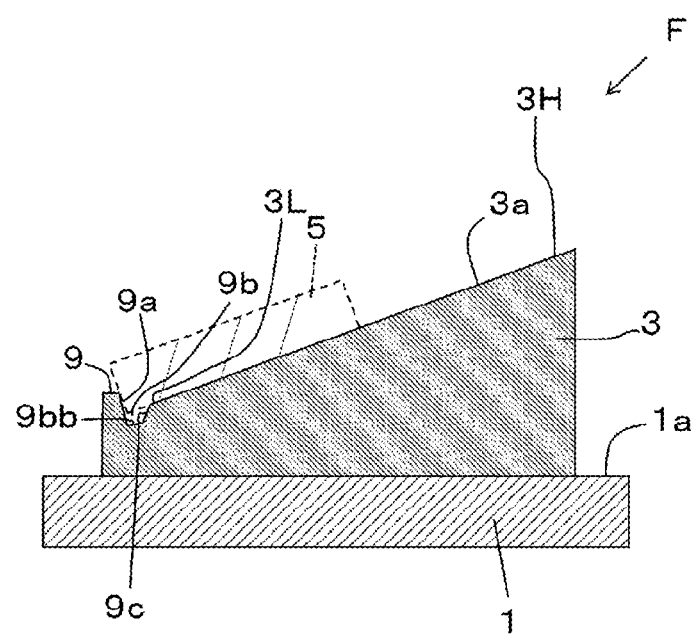
FIG. 9 is a cross-sectional view along line ix-ix in FIG. 8.

FIG. 8 is a perspective view that schematically illustrates another aspect of a substrate for mounting a light-emitting element. FIG. 9 is a cross-sectional view along line ix-ix in FIG. 8. A substrate for mounting a light-emitting element F as illustrated in FIG. 8 and FIG. 9 has a groove part 9b on a side of the dam part 9 of the sloping surface 3a. In such a case, a bottom part 9bb of the groove part 9b is provided at a position that is deeper than the top surface 3a. That is, the striking surface 9a of the dam part 9 reaches a position that is deeper than the top surface 3a. As the groove part 9b is formed near the dam part 9 and further the striking surface 9a reaches a position that is deeper than the top surface 3a, a surface of the light-emitting element 5 readily contacts the striking surface 9a. Thereby, it is possible to improve a positioning accuracy when the light-emitting element 5 is mounted on the mounting part 3aa of the top surface 3a. Additionally, for a wall surface 9c of the groove part 9b on an opposite side of the striking surface 9a, the wall surface 9c is preferably of a shape that slopes toward a side of the higher position part 3H so as to be perpendicular to the front surface 1a of the substrate 1 or open an upper side of the groove part 9b greatly.

A structure where the groove part 9b is not formed on the sloping surface 3a, for example, a case where a part that changes from the sloping surface 3a to the striking surface 9a is of a curved shape, is assumed. In a case of such a shape, the light-emitting element 5 may be stranded on such a curved part. In a case of the base 3 with such a structure, it is difficult to cause the light-emitting element 5 to contact the sloping surface 3a and the striking surface 9a simultaneously and accurately. In such a case, a variation in a directionality of light $p_h$ that is emitted from the light-emitting element 5 is increased.

Figure 10:
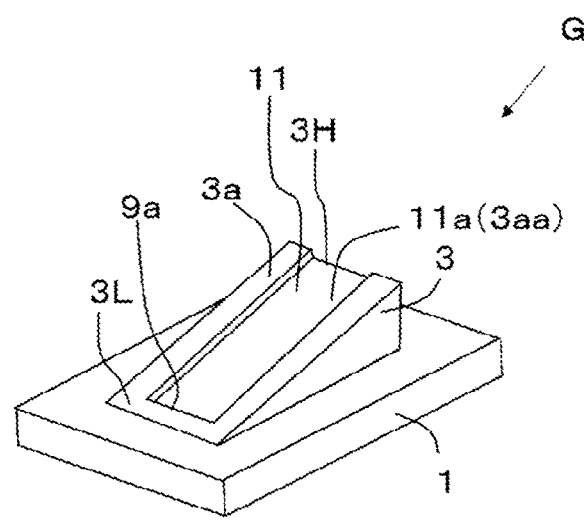
FIG. 10 is a perspective view that schematically illustrates another aspect of a substrate for mounting a light-emitting element.

FIGS. 10 to 15 are perspective views that schematically illustrate other aspects of a substrate for mounting a light-emitting element. Substrates for mounting a light-emitting element G to L as illustrated in FIGS. 10 to 15 have a recessed part 11 for placing the light-emitting element 5 on the top surface 3a of the base 3. Among them, the substrate for mounting a light-emitting element G as illustrated in FIG. 10 is structured to provide the recessed part 11 on the sloping surface 3a of the substrate for mounting a light-emitting element A as illustrated in FIGS. 1 and 2. In such a case, a bottom 11a of the recessed part 11 is provided as the mounting part 3aa for the light-emitting element 5. Furthermore, the bottom 11a is parallel to the top surface 3a other than the recessed part 11. Furthermore, the recessed part 11 is formed so as to leave a part of the sloping surface 3a on a side of the lower position part 3L. Hence, the striking surface 9a is formed on a side of the lower position part 3L. On the other hand, a side of the higher position part 3H is structured to cut the sloping surface 3a to an upper end of the higher position part 3H.

Figure 11:
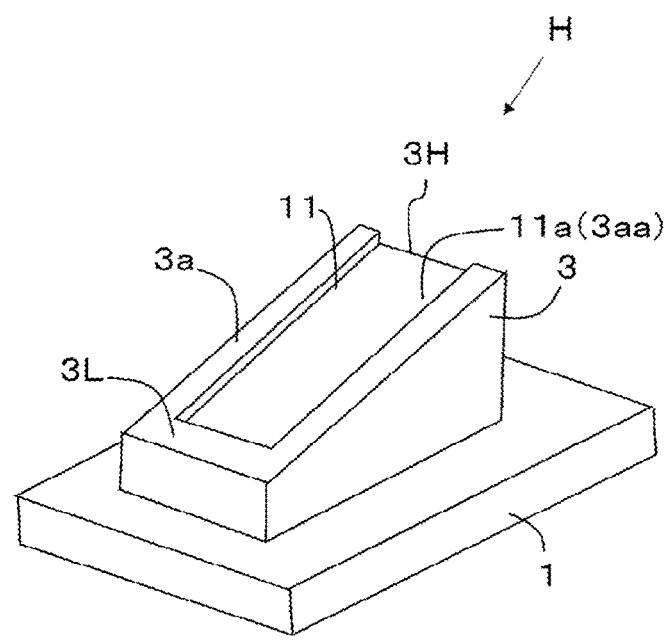
FIG. 11 is a perspective view that schematically illustrates another aspect of a substrate for mounting a light-emitting element.

The substrate for mounting a light-emitting element H as illustrated in FIG. 11 is provided in such a manner that the recessed part 11 is provided on the sloping surface 3a of the substrate for mounting a light-emitting element B as illustrated in FIG. 3. A structure of the recessed part 11 is similar to that of the substrate for mounting a light-emitting element G as illustrated in FIG. 10. Also in such a case, the bottom 11a of the recessed part 11 is provided as the mounting part 3aa for the light-emitting element 5.

Figure 12:
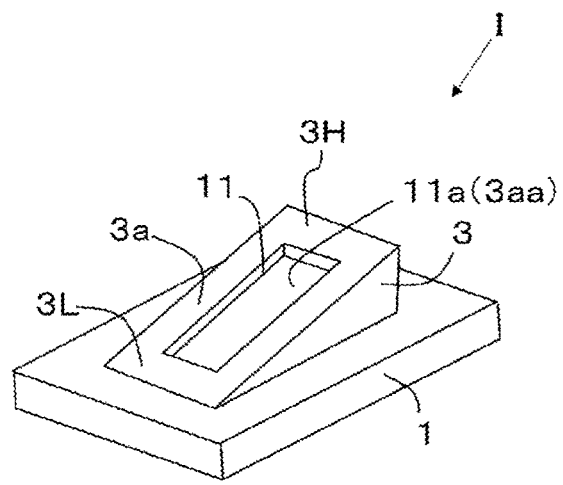
FIG. 12 is a perspective view that schematically illustrates another aspect of a substrate for mounting a light-emitting element.

The substrate for mounting a light-emitting element I as illustrated in FIG. 12 is structured to leave a part of the top surface (sloping surface) 3a on a side of the higher position part 3H of the base 3 in the substrate for mounting a light-emitting element G as illustrated in FIG. 10. Also in such a case, the bottom 11a of the recessed part 11 is provided as the mounting part 3aa for the light-emitting element 5.

Figure 13:
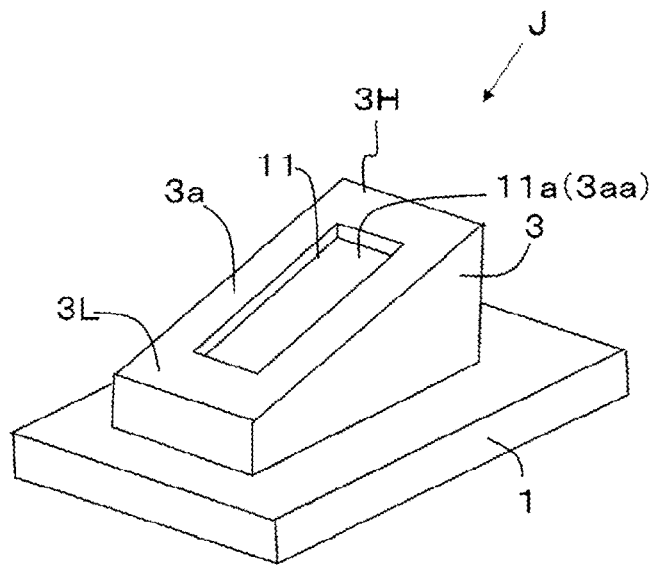
FIG. 13 is a perspective view that schematically illustrates another aspect of a substrate for mounting a light-emitting element.

The substrate for mounting a light-emitting element J as illustrated in FIG. 13 is structured to leave a part of the top surface (sloping surface) 3a on a side of the higher position part 3H of the base 3 in the substrate for mounting a light-emitting element G as illustrated in FIG. 11. Also in such a case, the bottom 11a of the recessed part 11 is provided as the mounting part 3aa for the light-emitting element 5.

Figure 14:
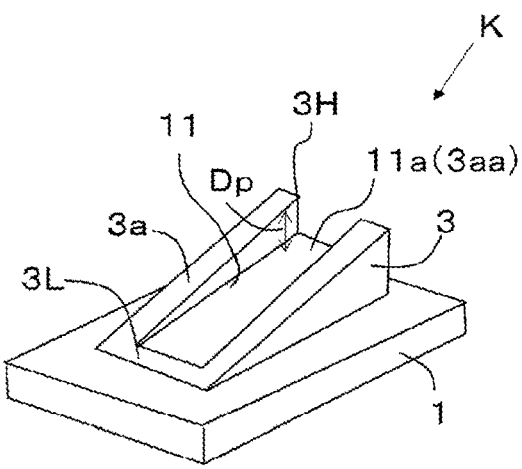
FIG. 14 is a perspective view that schematically illustrates another aspect of a substrate for mounting a light-emitting element.

The substrate for mounting a light-emitting element K as illustrated in FIG. 14 is provided in such a manner that a depth Dp of the recessed part 11 increases from a side of the lower position part 3L to a side of the higher position part 3H in the substrate for mounting a light-emitting element G as illustrated in FIG. 10. Also in such a case, the bottom 11a of the recessed part 11 is provided as the mounting part 3aa for the light-emitting element 5. A depth Dp of the recessed part 11 is a depth from the top surface (sloping surface) 3a to the bottom 11a of the recessed part 11. A direction of such a depth is a direction that is perpendicular to the front surface 1a of the substrate 1.

Figure 15:
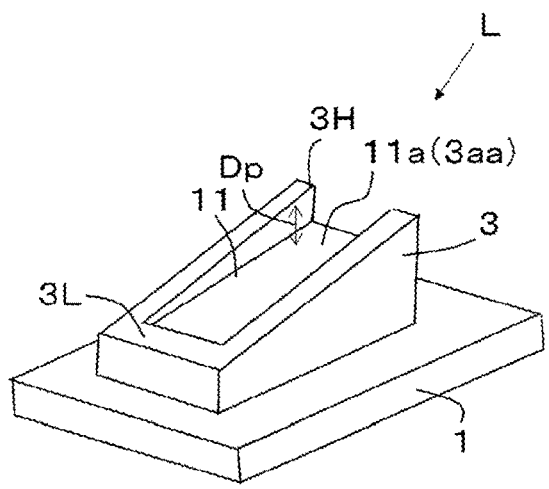
FIG. 15 is a perspective view that schematically illustrates another aspect of a substrate for mounting a light-emitting element.

The substrate for mounting a light-emitting element L as illustrated in FIG. 15 is provided in such a manner that a depth Dp of the recessed part 11 increases from a side of the lower position part 3L to a side of the higher position part 3H in the substrate for mounting a light-emitting element H as illustrated in FIG. 11. Also in such a case, the bottom 11a of the recessed part 11 is provided as the mounting part 3aa for the light-emitting element 5.

As the recessed part 11 with a structure as described above is formed on the top surface (sloping surface) 3a of the base 3, it is possible to fix the light-emitting element 5 on the mounting part 3aa more stably. Furthermore, it is possible to improve a positioning accuracy of the light-emitting element 5 on the top surface (sloping surface) 3a. Moreover, when the light-emitting element 5 is mounted on the mounting part 3aa of the base 3, the light-emitting element 5 is structured to be buried in the recessed part 11, so that a contact surface area between the light-emitting element 5 and the base 3 is increased. Thereby, it is possible to improve a heat releasing property of the light-emitting element 5.

Figure 16:
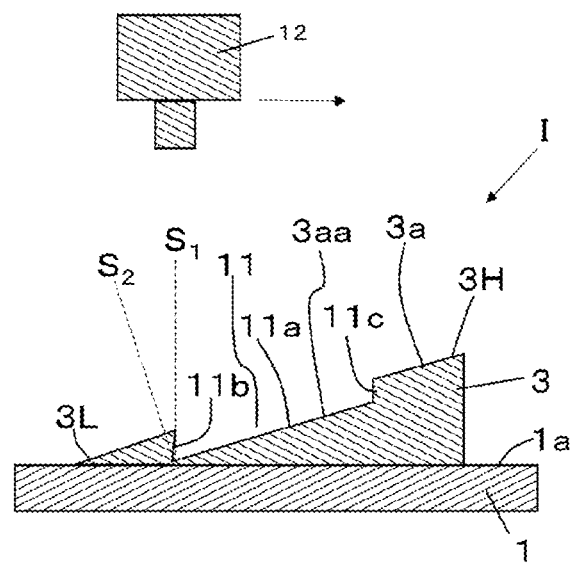
FIG. 16 is a cross-sectional view that schematically illustrates another aspect of a substrate for mounting a light-emitting element.

FIG. 16 is a cross-sectional view of the substrate for mounting a light-emitting element as illustrated in FIG. 12. $S_1$ and $S_2$ as indicated in FIG. 16 are index lines that are conveniently drawn so as to indicate a magnitude of an angle with respect to the front surface 1a of the substrate 1. The index line $S_1$ is drawn so as to be oriented in a direction that is perpendicular to the front surface 1a of the substrate 1. The index line $S_2$ is drawn so as to be oriented in a direction that is perpendicular to the sloping surface 3a of the base 3. In a case of a substrate for mounting a light-emitting element that has the recessed part 11 on the mounting surface 3a of the base 3, an inner wall 11b of the recessed part 11 on a side of the lower position part 3L is preferably perpendicular to the front surface 1a of the substrate 1 as indicated by the index line $S_1$ in FIG. 16. In addition thereto, an inner wall 11c of the recessed part 11 on a side of the higher position part 3H is also preferably perpendicular to the front surface 1a of the substrate 1.

As illustrated in FIG. 16, in a case where the inner wall 11b of the recessed part 11 on a side of the lower position part 3L is provided with an angle as indicated by the index line $S_1$, an upper side and a lower side of the inner walls 11b, 11c of the recessed part 11 are provided at identical positions thereof when viewing the recesses part 11 from above and perpendicularly to the front surface 1a of the substrate 1. In other words, in a case where the inner wall 11b of the recessed part 11 on a side of the lower position part 3L is provided with an angle as indicated by the index line $S_1$, the recessed part 11 is provided with a shape in such a manner that it is gouged in a direction that is perpendicular to the front surface 1a of the substrate 1. Herein, "from above" means "downward" in a direction that is perpendicular to the front surface 1a of the substrate 1 from a position of an image processing device 12 as illustrated in FIG. 16. In a case where the recessed part 11 is provided with a shape in such a manner that it is gouged in a direction that is perpendicular to the front surface 1a of the substrate 1, it is possible to place the light-emitting element 5 accurately, according to positional information of the recessed part 11 that is captured by the image processing device 12.

On the other hand, in a case where the inner wall 11b of the recessed part 11 on a side of the lower position part 3L is provided with an angle as indicated by the index line $S_2$, an upper side and a lower side of the inner walls 11b, 11c of the recessed part 11 are provided in a state where they are not provided at identical positions thereof.

The inner wall 11b of the recessed part 11 on a side of the lower position part 3L being provided with an angle as indicated by the index line $S_2$ is the recessed part 11 provided with a shape in such a manner that it is gouged in a direction that is perpendicular to the sloping surface 3a.

In a case where the inner wall 11b of the recessed part 11 on a side of the lower position part 3L is provided with an angle as indicated by the index line $S_2$, an upper side and a lower side of the inner walls 11b, 11c of the recessed part 11 are provided in a state where they are not provided at identical positions thereof when viewing the recesses part 11 downward in a direction that is perpendicular to the front surface 1a of the substrate 1 from the image processing device 12. When the image processing device 12 moves the recessed part 11 between the lower position part 3L and the higher position part 3H on the sloping surface 3a on the substrate 1, a difference between positions of an upper side (a position of the sloping surface 3a of the base 3) and a lower side (a position of the bottom 11a of the recessed part 11) of the inner walls 11b, 11c of the recessed part 11 in a horizontal direction is incorporated in positional information of the recessed part 11 that is obtained by the image processing device 12. Such a difference is added to positional information of the recessed part 11 that is captured by the image processing device 12, so that an error in positional accuracy at a time when the light-emitting element 5 is placed is readily caused. On the other hand, it is possible for the substrate for mounting a light-emitting element I as illustrated in FIG. 12 and FIG. 16 to assemble a light-emitting device accurately as described above.

Additionally, a structure where the inner wall 11b of the recessed part 11 on a side of the lower position part 3L is perpendicular to the front surface 1a of the substrate 1 is not limited to the substrate for mounting a light-emitting element as illustrated in FIG. 12 and is also capable of being similarly applied to the substrates for mounting a light-emitting element as illustrated in FIG. 13 and FIG. 15 respectively.

Figure 17:
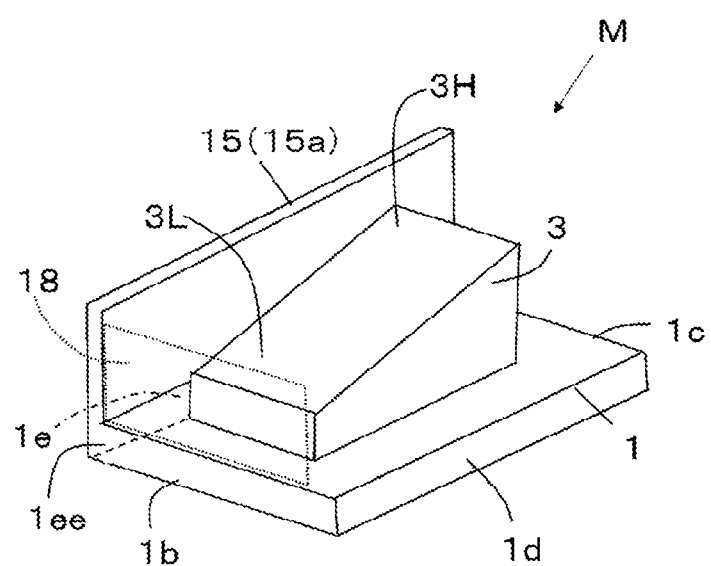
FIG. 17 is a perspective view that schematically illustrates another aspect of a substrate for mounting a light-emitting element.
Figure 18:
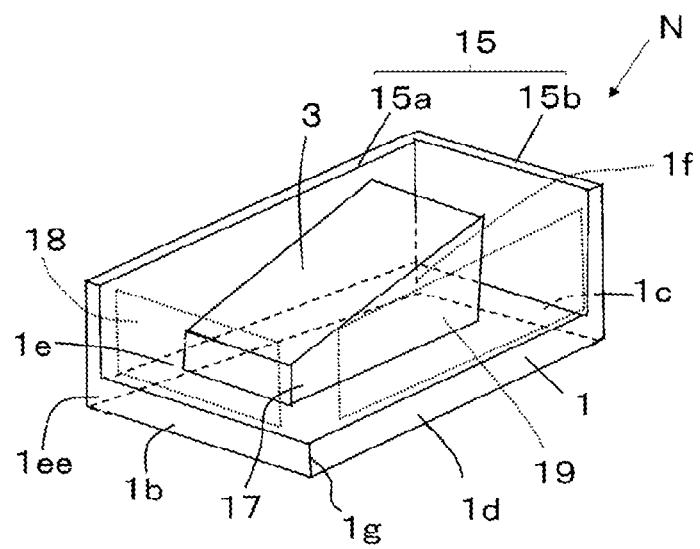
FIG. 18 is a perspective view that schematically illustrates another aspect of a substrate for mounting a light-emitting element.
Figure 19:
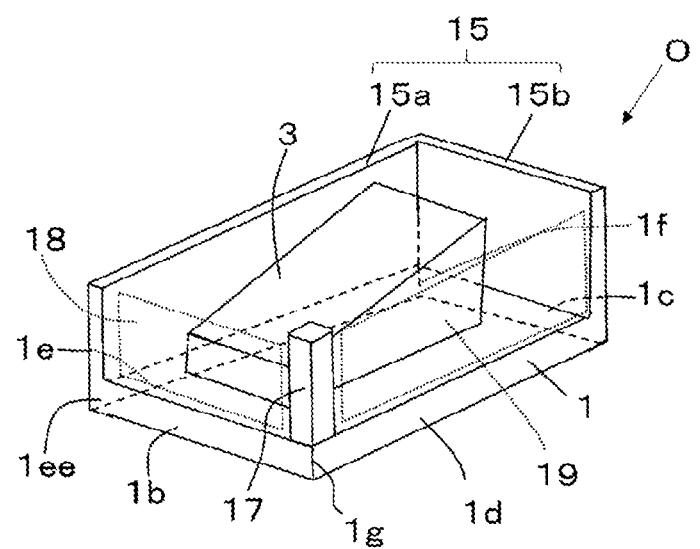
FIG. 19 is a perspective view that schematically illustrates another aspect of a substrate for mounting a light-emitting element.

FIGS. 17 to 19 are perspective views that schematically illustrate other aspects of a substrate for mounting a light-emitting element. Substrates for mounting a light-emitting element M to O as illustrated in FIGS. 17 to 19 have a wall member(s) 15 on the substrate 1. For the substrates for mounting a light-emitting element M to O as illustrated in FIGS. 17 to 19, their shapes are rectangular shapes when the substrate 1 is provided in a plan view. In other words, a shape of the substrate 1 is a so-called rectangular shape that has two side surfaces 1d, 1e that are provided at a right angle with respect to the two end surfaces 1b, 1c, respectively. The substrate 1 has a first wall member 15a that is provided to stand with respect to the front surface 1a, on an edge part 1ee on a side of one side surface 1e among the two side surfaces 1d, 1e. The first wall member 15a is arranged so as to be parallel to a longitudinal direction of the base 3 (a direction from the higher position part 3H to the lower position part 3L).

The substrate for mounting a light-emitting element N as illustrated in FIG. 18 has a second wall member 15b along the end surface 1c of the substrate 1 in the substrate for mounting a light-emitting element M as illustrated in FIG. 17. The second wall member 15b is arranged so as to be linked to the first wall member 15a at one corner part if where the end surface 1c and the side surface 1e of the substrate 1 intersects. The first wall member 15a and the second wall member 15b are provided so as to compose an L-shape when the substrate 1 is provided in a plan view. In such a case, the first wall member 15a and the second wall member 15b are provided at identical heights thereof.

The substrate for mounting a light-emitting element O as illustrated in FIG. 19 is structured to provide a post member 17 on a corner part 1g of the substrate 1 where none of the first wall member 15a and the second wall member 15b is provided, in the substrate for mounting a light-emitting element N as illustrated in FIG. 18.

Such substrates for mounting a light-emitting element M to O are arranged in such a manner that the first wall member 15a is oriented in a direction that is parallel to a direction of travel of light $p_h$ that is emitted from the light-emitting element 5. According to such a configuration, it is possible to check a state (a degree of convergence), a tilt of a direction of travel, and the like of light $p_h$ that is emitted from the light-emitting element 5 in a state where it is reflected on the first wall member 15a. In such a case, a surface of the first wall member 15a is preferably a mirror surface.

Furthermore, in the substrates for mounting a light-emitting element N and O, the second wall member 15b is provided at a position opposite to a direction of travel of light $p_h$ that is emitted from the light-emitting element 5 (an aperture part as indicated by sign 18). As such a configuration is provided, it is also possible to check a state (a degree of convergence and an intensity), a tilt of a direction of travel, and the like of light $p_h$ that is emitted from the light-emitting element 5 between the surface 7a of the base material 7 and the second wall member 15b that is positioned on an opposite side thereof, on a side of the first wall member 15a as well as a surface on an opposite side of the light-emitting surface 5a of the light-emitting element 5. Also in such a case, a surface of the second wall member 15b is preferably a mirror surface.

Moreover, in the substrate for mounting a light-emitting element O, the post member 17 is provided on the corner part 1g where none of the first wall member 15a and the second wall member 15b is provided. According to such a configuration, it is also possible to stably place a (non-illustrated) lid body on the wall member(s) 15 (the first wall member 15a and the second wall member 15b), for example, even in a case where the lid body is placed thereon or the like, on a corner part where the wall member(s) 15 is/are not provided.

Furthermore, the substrate for mounting a light-emitting element O is structured not to provide the wall member(s) 15 between the second wall member 15b and the post member 17 but to provide an aperture 19 therebetween. According to such a configuration, it is also possible to directly check a state (a degree of convergence and an intensity), a tilt of a direction of travel, and the like of light $p_h$ that is emitted from the light-emitting element 5. Furthermore, attachment or detachment of the light-emitting element 5 for the mounting part 3aa is facilitated, so that it is possible to readily execute replacement and repair of the light-emitting element 5.

Although a structure of the base 3 as illustrated in FIG. 3 is illustrated as an example in FIG. 17 to FIG. 19, it is also possible to similarly apply a structure of the wall member(s) 15 and the post member 17 as illustrated in FIG. 17 to FIG. 19 to the substrates for mounting a light-emitting element as illustrated in FIG. 1, FIG. 4, FIG. 5, FIG. 6, FIG. 8, FIG. 10, FIG. 11, FIG. 12, FIG. 13, FIG. 14, and FIG. 15, other than the substrate for mounting a light-emitting element B as illustrated in FIG. 3. Furthermore, other than the substrates for mounting a light-emitting element O to M, a structure where the wall member 15 is provided on only a side of the end surface 1c of the substrate 1 may be provided. Additionally, the first wall member 15a, the second wall member 15b, and the post member 17 are preferably formed of a ceramic by a sintered body of a ceramic particle(s), integrally with the substrate 1 and the base 3. Thereby, the substrates for mounting a light-emitting element O to M have a higher heat releasing property.

Figure 20:
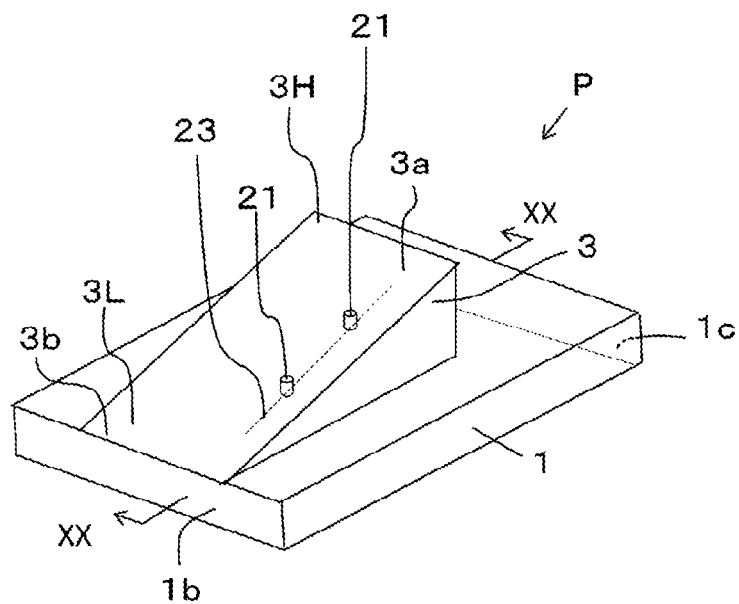
FIG. 20 is a perspective view that schematically illustrates another aspect of a substrate for mounting a light-emitting element.
Figure 21:
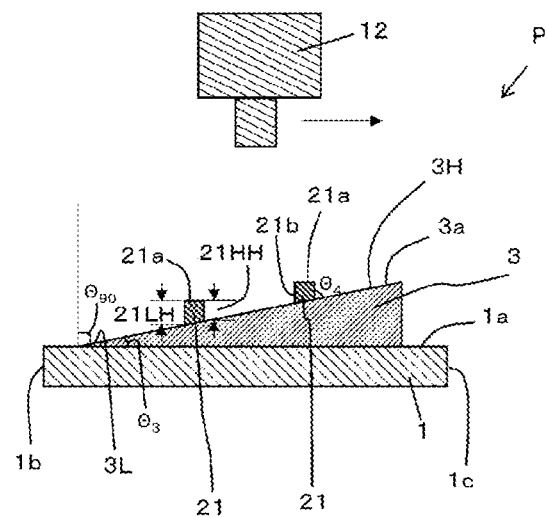
FIG. 21 is a cross-sectional view along line xx-xx in FIG. 20.

FIG. 20 is a perspective view that schematically illustrates another aspect of a substrate for mounting a light-emitting element. FIG. 21 is a cross-sectional view along line xx-xx in FIG. 20. A substrate for mounting a light-emitting element P as illustrated in FIG. 20 and FIG. 21 is based on the substrate for mounting a light-emitting element A as illustrated in FIG. 1 and FIG. 2. In the substrate for mounting a light-emitting element P as illustrated in FIG. 20 and FIG. 21, a positioning reference(s) 21 for determining a mounting position for the light-emitting element 5 is/are provided. Then, the light-emitting element 5 is positioned by using such a positioning reference(s) 21, so that it is possible to place the light-emitting element 5 at a predetermined position of the mounting surface 3a more accurately. Therefore, in a case of a structure where the light-emitting element 5 that has an elongated shape such as a semiconductor laser is mounted on the sloping surface 3a of the base 3, it is possible to readily align a light axis of light ph that is emitted from the light-emitting surface 5a in a predetermined direction. Thereby, it is possible to obtain a light-emitting device with a small displacement of a light axis.

Figure 22:
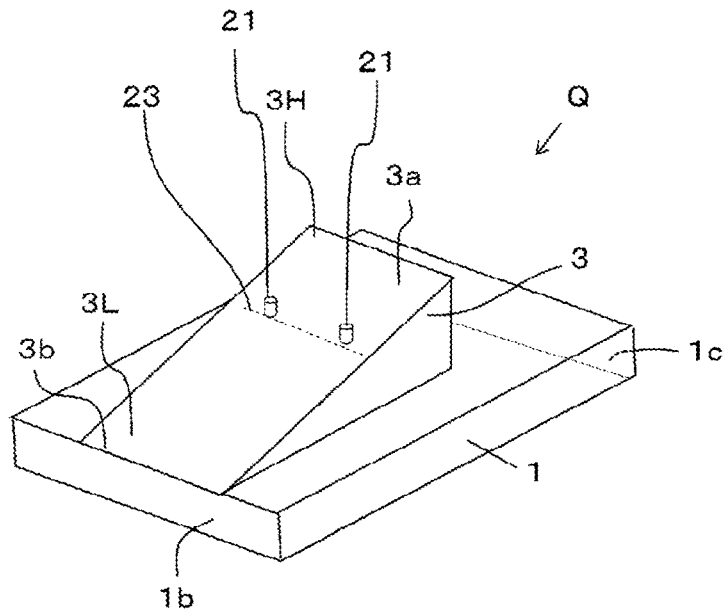
FIG. 22 is a perspective view that schematically illustrates another aspect of a substrate for mounting a light-emitting element.

Herein, it is sufficient for the positioning reference(s) 21 to be capable of being recognized as a shape that is different from that of the sloping surface 3a of the base 3 by the image processing device 12 such as a camera. A planar shape such as a circular shape or a rectangular shape may be provided other than a solid shape that composes a protruding shape as illustrated in FIGS. 20 to 22. Moreover, a shape that is provided in a plan view is a circular shape or a rectangular shape where it may be a dent or a through-hole. Moreover, for example, not a shape or a contour but a color tone may be different between the sloping surface 3a and the positioning reference(s) 21. Furthermore, the positioning reference(s) 21 may be of a protruding shape that is formed integrally with the sloping surface 3a of the base 3.

Furthermore, in a case where the positioning reference(s) 21 is/are of a protruding shape that is formed on the sloping surface 3a of the base 3, an upper bottom surface(s) 21a of the positioning reference(s) 21 is/are preferably parallel to the front surface 1a of the substrate 1.

As the positioning reference(s) 21 is/are of such a shape, and when the image processing device 12 such as a camera is moved, for example, in a direction from the lower position part 3L to the higher position part 3H of the sloping surface 3a, so as to view the positioning reference(s) 21 in a direction that is perpendicular to the front surface 1a of the substrate 1, the positioning reference(s) 21 is/are readily reflected as an isotropic shape such as a circle or a square shape. As the positioning reference(s) 21 is/are read from above by the image processing device 12, it is possible to detect an edge(s) of the positioning reference(s) 21 sharply. That is, it is possible to detect a position of the positioning reference 21 more accurately.

Furthermore, the positioning reference(s) 21 where the upper bottom surface(s) 21a is/are parallel to the front surface 1a of the substrate 1 may be of a shape where a surface area of a cross section that is parallel to the upper bottom surface(s) 21a of a barrel part(s) 21b is equivalent to a surface area of the upper bottom surface(s) 21a. Specifically, the positioning reference(s) 21 may be a circular cylinder or a prismatic column that has a shape where surface areas of cross sections thereof in a direction that is perpendicular to the upper bottom surface(s) 21a are identical. In such a case, the barrel part(s) 21b/are a site(s) that is/are formed by a side surface(s) that is/are perpendicular to the upper bottom surface(s) 21a of the positioning reference(s) 21. Furthermore, the positioning reference(s) 21 may be of a shape where a height from the sloping surface 3a to the upper bottom surface(s) 21a differs between a side of the lower position part 3L and a side of the higher position part 3H of the base 3. That is, the positioning reference(s) 21 may be of a shape where a height 21L from the sloping surface 3a to the upper bottom surface(s) 21a on a side of the lower position part 3L of the base 3 is greater (longer in a distance) than a height 21H from the sloping surface 3a to the upper bottom surface(s) 21a on a side of the higher position part 3H of the base 3. In such a case, when an angle that is perpendicular to the front surface 1a of the substrate 1 is 90° and $\theta_3$ is an angle of the sloping surface 3a with respect to the front surface 1a of the substrate 1, an angle ($\theta_4$) between the positioning reference(s) 21 and the sloping surface 3a has preferably a relationship of $\theta_3+\theta_4=90°$. In such a case, an angle ($\theta_4$) between the positioning reference(s) 21 and the sloping surface 3a is an angle between a direction where the positioning reference(s) 21 is/are provided to stand and the sloping surface 3a.

Furthermore, a plurality of positioning references 21 may be arranged on the sloping surface 3a as illustrated in FIG. 20 and FIG. 22. As the positioning references 21 are arranged at, for example, two sites on the sloping surface 3a, a straight line that connects both of the positioning references 21 at the two sites is provided as a reference line 23 and it is possible to determine arrangement of the light-emitting element 5 based on a position of such a reference line 23. Additionally, a structure may be provided in such a manner that a plurality of the positioning references 21 are arranged in a direction that is perpendicular to a direction from the higher position part 3H to the lower position part 3L of the base 3 as illustrated in FIG. 22, that is, a direction along the end surfaces 1b, 1c of the substrate 1, as well as arrangement where they are aligned in a direction from the higher position part 3H to the lower position part 3L of the base 3 as illustrated in FIG. 20.

Additionally, in a case where the upper bottom surface(s) 21a of the positioning reference(s) 21 is/are parallel to the sloping surface 3a, or a case where the positioning reference(s) 21 is/are placed so as to be oriented in a direction that is perpendicular to the sloping surface 3a of the base 3, an orientation(s) of the upper bottom surface(s) 21a of the positioning reference(s) 21 is/are an orientation(s) not to face the image processing device 12. In such a case, for example, if a shape(s) of the upper bottom surface(s) 21a of the positioning reference 21 is/are a circular shape, an elliptical shape is viewed. As a result, a displacement of a position of a center point of the upper bottom surface(s) 21a of the positioning reference(s) 21 may be increased.

On the other hand, in a case of the positioning references 21 that are arranged as illustrated in FIG. 20 and FIG. 21, a shape of the upper bottom surface(s) 21a of the positioning reference(s) 21 is directly reflected as a circular shape, so that it is possible to decrease a displacement of a position(s) of a center point(s) of the detected upper bottom surface(s) 21a. That is, in a configuration as described above, it is possible to arrange, at high accuracy, the light-emitting element 5 that is mounted on the mounting surface 3a of the base 3.

Figure 23:
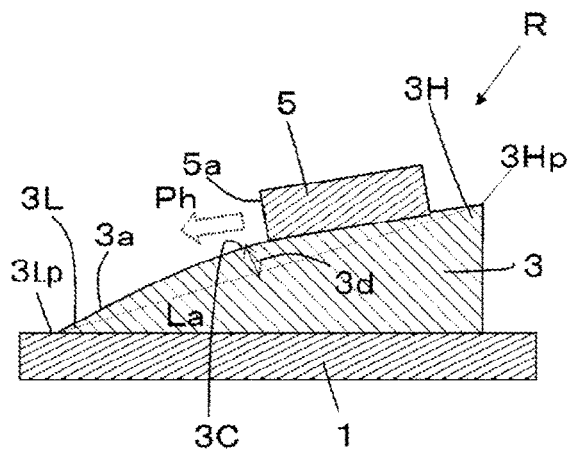
FIG. 23 is a cross-sectional view that schematically illustrates another aspect of a substrate for mounting a light-emitting element.

FIG. 23 is a cross-sectional view that schematically illustrates another aspect of the substrate for mounting a light-emitting element as illustrated in FIG. 2. As a substrate for mounting a light-emitting element R as illustrated in FIG. 23 is provided as an example, a shape may be provided in such a manner that the top surface (sloping surface) 3a of the base 3 is curved upward so as to be of a protruding shape. Herein, a shape where the top surface (sloping surface) 3a of the base 3 is curved upward so as to be of a protruding shape refers to, for example, a state where, when an end part 3Hp of the higher position part 3H and an end part 3Lp of the lower position part 3L of the base 3 are connected by a straight line La, the sloping surface 3a is positioned on an upper side of such a straight line La. Herein, a state where the sloping surface 3a is positioned on an upper side with respect to such a straight line La refers to a case where a width 3d between the straight line La and an intermediate point 3C is 2 µm or greater. The width 3d between the straight line La and the intermediate point 3C is preferably 5 to 15 µm.

Additionally, for a shape where the top surface (sloping surface) 3a of the base 3 composes a shape that is curved upward so as to be a protruding shape, a shape where a gradient of the sloping surface 3a is large on a side of the lower position part 3L is preferable. That is, a site where the width 3d between the sloping surface 3a and the straight line La is maximum is preferably provided on a side of the lower position site 3L. As a shape where a gradient of the sloping surface 3a is large on a side of the lower position part 3L is provided, and when, for example, the light-emitting element 5 is placed on a side of the higher position part 3H of the sloping surface 3a of the base 3 as illustrated in FIG. 23, it is possible to reduce reflecting of light Ph that is emitted from the light-emitting element 5 from the sloping surface 3a. Thereby, it is possible to improve a light emission efficiency of light Ph that is emitted from the substrate for mounting a light-emitting element R to an outside thereof.

A structure where the top surface (sloping surface) 3a of the base 3 composes a shape that is curved upward so as to be a protruding shape is not limited to the substrate for mounting a light-emitting element A as illustrated in FIG. 2 and is also capable of being similarly applied to the substrates for mounting a light-emitting element B, C, and D as illustrated in FIG. 3, FIG. 4, and FIG. 5, respectively.

Figure 24:
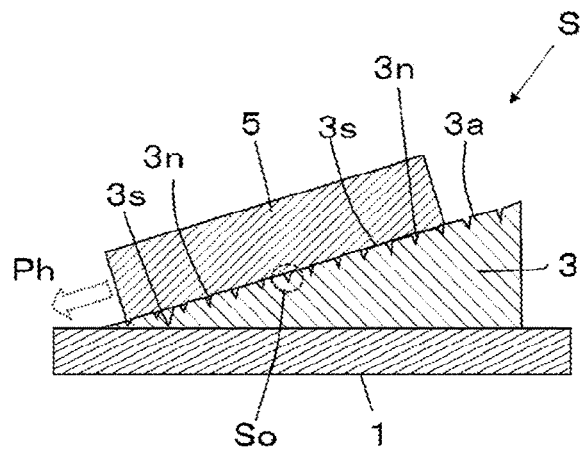
FIG. 24 is a cross-sectional view that schematically illustrates another aspect of a substrate for mounting a light-emitting element.
Figure 25:
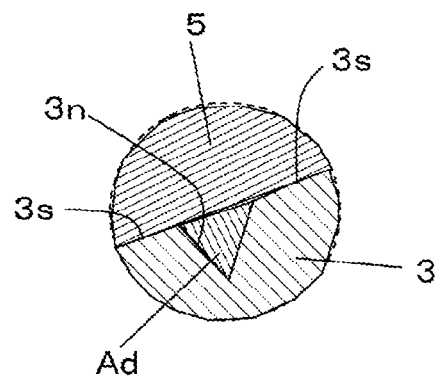
FIG. 25 is a cross-sectional view where an So part as illustrated in FIG. 24 is enlarged.

FIG. 24 is a cross-sectional view that schematically illustrates another aspect of the substrate for mounting a light-emitting element as illustrated in FIG. 2. FIG. 25 is a cross-sectional view where an So part as illustrated in FIG. 24 is enlarged. A substrate for mounting a light-emitting element S as illustrated in FIG. 24 is structured in such a manner that the top surface (sloping surface) 3a of the base 3 composes a protruding and recessed shape. Although only a cross section of a structure where the top surface (sloping surface) 3a of the base 3 has a protruding and recessed shape is illustrated in FIG. 24, a structure is provided in such a manner that a recessed part(s) and a protruding part(s) substantially uniformly extend in a direction of a back of a plane of paper. That is, the sloping surface 3a of the base 3 in such a substrate for mounting a light-emitting element S is provided with a structure where a recess(es) and a protrusion(s) are alternately aligned in a direction from the higher position part 3H to the lower position part 3L of the base 3.

As the top surface (sloping surface) 3a of the base 3 is structured to compose a recessed and protruding shape, and when the light-emitting element 5 is placed on the top surface 3a, a protruding part(s) 3s is/are a part(s) that contact(s) the light-emitting element 5 and a recessed part(s) 3n is/are a part(s) that does/do not contact the light-emitting element 5. As the top surface 3a of the base 3 is of such a recessed and protruding shape, it is possible to provide a state where a bonding material Ad for bonding the light-emitting element 5 fills the recessed part(s) 3n and is not applied on the protruding part(s) 3s. Thereby, it is possible to bond the light-emitting element 5 to the top surface 3a in a state where it directly contacts the protruding part(s) 3s of the base 3. Thereby, it is possible to improve a heat releasing property from the light-emitting element 5 to the base 3. In such a case, a surface roughness (Ra) of the sloping surface 3a is preferably 1 to 3 µm. Furthermore, for a rate of each of widths of the protruding part(s) 3s and the recessed part(s) 3n on the mounting part 3aa of the top surface 3a, when, within a range from the higher position part 3H to the lower position part 3L of the base 3, a width of the mounting part 3aa in such a direction is provided as 100%, a total of widths of the protruding parts 3s is preferably a rate of 20 to 80%. For example, in a case where a total of widths of the protruding parts 3s is 20%, another part of 80% is a total of widths of the recessed parts 3n. Furthermore, for the bonding material Ad, an adhesive material made of a resin, as well as an Au—Sn material, may be used. An Au—Sn material is preferable from a viewpoint of a heat releasing property.

Figure 26:
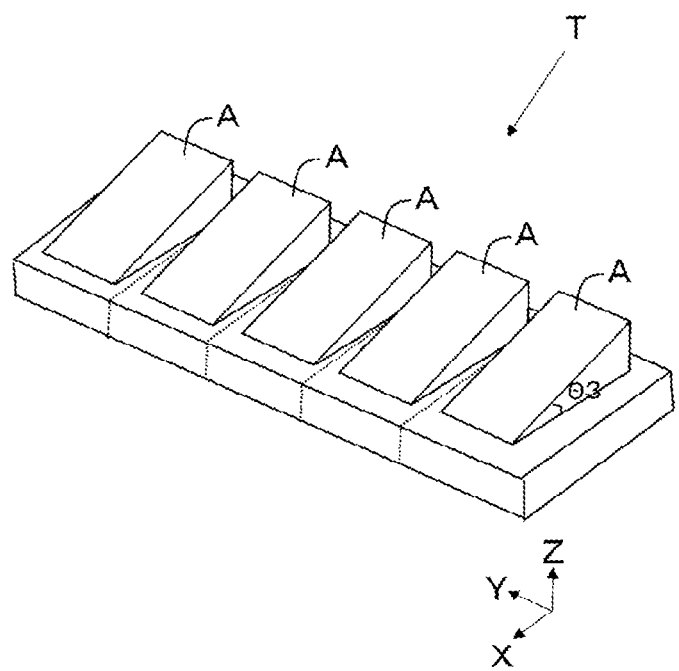
FIG. 26 is a perspective view that schematically illustrates an array substrate according to an embodiment.

FIG. 26 is a perspective view that schematically illustrates an array substrate according to an embodiment. An array substrate T as illustrated in FIG. 26 is provided in such a manner that a plurality of the substrates for mounting a light-emitting element A are joined, and thereby, it is possible to obtain an array-type light-emitting device.

In a case of the array substrate T, it is also possible to change an angle θ3 of the sloping surface 3a, an orientation of the sloping surface 3a, and the like of the base 3, for each substrate for mounting a light-emitting element A. In such a case, an orientation of the sloping surface 3a means that an orientation of the sloping surface 3a (in such a case, a direction of an X-axis as a coordinate axis in FIG. 26) is changed in an X-Y plane of coordinate axes. If an angle θ3 of the sloping surface 3a and an orientation of the sloping surface 3a of the base 3 are changed for each substrate for mounting a light-emitting element A, it is possible to condense light $p_h$ from the light-emitting element 5 that is mounted on each substrate for mounting a light-emitting element A. Furthermore, it is possible to increase a range of light $p_h$ to be condensed.

Furthermore, the array substrate T according to an embodiment is provided in such a manner that both of the substrates for mounting a light-emitting element A are sintered integrally. Thereby, it is possible to obtain an array-type light-emitting device with a high heat releasing property and a high intensity. For the array substrate T, it is possible to mount the light-emitting elements 5 with respective different colors on the respective substrates for mounting a light-emitting element A and it is also possible to form light $p_h$ with a wide wavelength range. Additionally, although an example of a structure where a plurality of the substrates for mounting a light-emitting element A as illustrated in FIG. 1 and FIG. 2 are joined, as a substrate for mounting a light-emitting element, is illustrated in FIG. 26, it is also possible to similarly apply it to a substrate for mounting a light-emitting element that has the base 3 with a structure as described above, other than the base 3 as illustrated in FIG. 1 and FIG. 2 as mentioned above.

Figure 27:
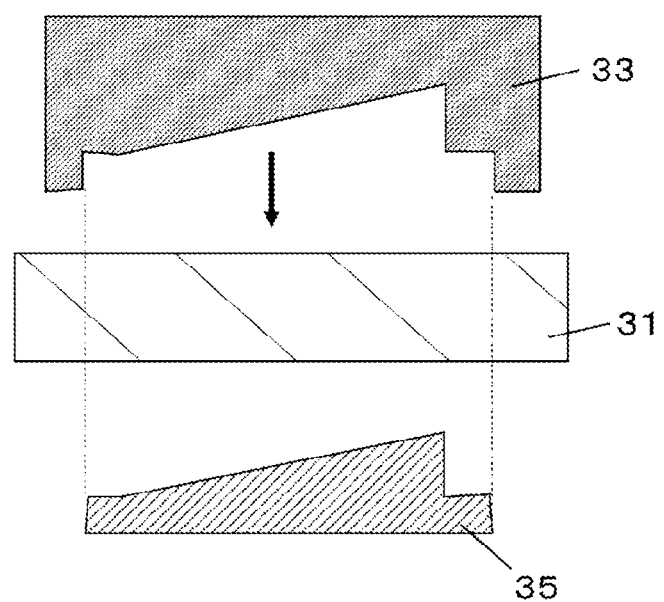
FIG. 27 is a cross-sectional view that illustrates a manufacturing process for a substrate for mounting a light-emitting element according to an embodiment.

Next, a manufacturing method for a substrate for mounting a light-emitting element according to each embodiment will be explained. FIG. 27 is a cross-sectional view that illustrates a manufacturing process for a substrate for mounting a light-emitting element according to an embodiment. In FIG. 27, a method for fabricating the substrate for mounting a light-emitting element A as illustrated in FIG. 1 and FIG. 2 will be explained.

First, as illustrated in FIG. 27, a green sheet 31 is prepared that is preliminarily processed into a predetermined shape. Then, stamping is executed from a top to a bottom of the green sheet 31 by using a press die 33 with a predetermined shape so as to form a molded body 35 that is provided as the substrate for mounting a light-emitting element A.

Additionally, for the substrate for mounting a light-emitting element A, in a case where the substrate for mounting a light-emitting element A is fabricated that has an electrical conductor on at least one of a surface and an inside thereof, the green sheet 31 is preferably used where an electrical conductor pattern (that also includes a via electrical conductor) that is an electrical conductor is preliminarily formed on at least one of a surface and an inside of the green sheet 31.

Then, the fabricated molded body 35 is fired (a maximum temperature: 1500 to 1900° C.) so as to obtain the substrate for mounting a light-emitting element A.

It is also possible to obtain the other substrates for mounting a light-emitting element B to S other than the substrate for mounting a light-emitting element A and the array substrate T by using dies with respectively different shapes.

PRACTICAL EXAMPLES

A substrate for mounting a light-emitting element and an array substrate according to each embodiment were fabricated as follows and a laser diode (1.5 kW) was mounted thereon so as to fabricate a light-emitting device. The laser diode was bonded to each mounting part of the substrate for mounting a light-emitting element or the array substrate by an Au—Sn material. Furthermore, the laser diode was wire-connected by wire bonding. Supply of an electric power to the laser diode was executed from an electric power source through the wire bonding. Hence, the substrate for mounting a light-emitting element or array substrate that does not have an electrical conductor part on a surface or in an inside thereof was fabricated as a sample.

First, for a mixed powder for forming a green sheet, a mixed powder was prepared in such a manner that 5% by mass of a yttria powder and 1% by mass of a calcia powder were mixed into 94% by mass of an aluminum nitride in such a proportion.

Then, 20 parts by mass of an acryl-based binder as an organic binder and 50 parts by mass of toluene were added to 100 parts by mass of such a mixed powder (a solid content) so as to prepare a slurry, and then, a green sheet with a predetermined thickness was fabricated by using a doctor blade method.

Then, a molded body was fabricated by using the green sheet as described above, according to a manufacturing method as illustrated in FIG. 27.

Then, firing of the fabricated molded body was executed in a reducing atmosphere for 2 hours on a condition that a maximum temperature was 1800° C. to fabricate a substrate for mounting a light-emitting element and an array substrate. Additionally, a size of the fabricated substrate for mounting a light-emitting element was a width of 2.5 mm×a length of 4.2 mm in a shape after the firing. A height thereof is illustrated in Table 1. A size of a base (a mounting surface) was a width of 0.5 mm×a length of 1 mm. A thickness of a substrate was 0.1 mm. For the array substrate, a molded body was formed, fired, and fabricated so as to have a size in such a manner that five substrates for mounting a light-emitting element with a size as described above are joined as illustrated in FIG. 19. An angle (a sloping angle) of a top surface (sloping surface) of the base with respect to a front surface of the substrate is set at 40° for a sample with a structure in FIG. 14 and FIG. 15 and set at 30° for other samples. An angle of a mounting part with respect to the front surface of the substrate in the sample with a structure in FIG. 14 and FIG. 15 is set at 30°. Furthermore, a height h1 of a lower position part of the base in samples with structures in FIGS. 3, 5, 6, 8, 11, 13, 15, 17, 18, and 19 was 0.2 mm.

Then, for each fabricated light-emitting device, a silicon wafer was placed as a base material as illustrated in FIGS. 1 and 2, the laser diode is caused to emit light, and an intensity of light that is reflected to a side of a light-emitting element (reflected light) and a range of a variation in the intensity of such reflected light were measured. For an evaluation of an intensity of reflected light, a photodiode was used. For the array substrate, a sample was fabricated in such a manner that laser diodes were mounted on respective mounting surfaces of the array substrate as illustrated in FIG. 26, and an intensity of reflected light from each laser diode was measured. In a case of the array substrate, a photodiode was placed for each substrate for mounting a light-emitting element to execute measurement and an average value thereof was obtained.

For a sample as a comparative example (sample No. 17), a sample with a structure where a top surface (a mounting part) of a base was parallel to a front surface of a substrate was fabricated based on the substrate for mounting a light-emitting element as illustrated in FIG. 3, and a similar evaluation was executed. For sample No. 17, "top surface parallel to front surface" is described in Table 1. For an intensity of reflected light and a variation therein as illustrated in Table 1, a value that is normalized by a value of sample No. 17 is illustrated. For such an evaluation, each sample was evaluated while a sample number was 5.

TABLE 1

| Sample No. | Structure of substrate for mounting light-emitting element or array substrate Figure number | Height of substrate for mounting light-emitting element or array substrate mm | Dam part Presence/ Absence | Intensity ratio of reflected light | Range of variation in intensity of reflected light |
|---|---|---|---|---|---|
| 1 | 1 | 0.6 | Absence | 0.2 | 1 |
| 2 | 3 | 0.8 | Absence | 0.2 | 1 |
| 3 | 4 | 0.6 | Absence | 0.2 | 1 |
| 4 | 5 | 0.8 | Absence | 0.2 | 1 |
| 5 | 6 | 0.8 | Presence | 0.2 | 0.6 |
| 6 | 8 | 0.8 | Presence | 0.2 | 0.5 |

TABLE 1-continued

| Sample No. | Structure of substrate for mounting light-emitting element or array substrate Figure number | Height of substrate for mounting light-emitting element or array substrate mm | Dam part Presence/ Absence | Intensity ratio of reflected light | Range of variation in intensity of reflected light |
|---|---|---|---|---|---|
| 7 | 10 | 0.6 | Presence | 0.2 | 0.6 |
| 8 | 11 | 0.8 | Presence | 0.2 | 0.6 |
| 9 | 12 | 0.6 | Presence | 0.2 | 0.6 |
| 10 | 13 | 0.8 | Presence | 0.2 | 0.6 |
| 11 | 14 | 0.64 | Absence | 0.3 | 1 |
| 12 | 15 | 0.84 | Absence | 0.3 | 1 |
| 13 | 17 | 1 | Absence | 0.2 | 1 |
| 14 | 18 | 1 | Absence | 0.2 | 1 |
| 15 | 19 | 1 | Absence | 0.2 | 1 |
| 16 | 26 | 0.6 | Absence | 0.2 | 1 |
| 17 | (top surface parallel to front surface) | 0.6 | Absence | 1 | 1 |

As is clear from a result as illustrated in Table 1, an intensity of reflected light in a case of a substrate for mounting a light-emitting element where a top surface of a base was a sloping surface (sample Nos. 1 to 16) was low as compared with a substrate for mounting a light-emitting element where a top surface of a base was parallel to a front surface of a substrate (sample No. 17). Furthermore, a range of a variation in an intensity of reflected light in a substrate for mounting a light-emitting element with a structure where a dam part was provided on a sloping surface (sample Nos. 5 to 10) was small as compared with a substrate for mounting a light-emitting element with a structure where a dam part was not provided (sample Nos. 1 to 4 and 11 to 16).

An additional effect(s) or variation(s) can readily be derived by a person(s) skilled in the art. Hence, a broader aspect(s) of the present invention is/are not limited to a specific detail(s) and a representative embodiment(s) as illustrated and described above. Therefore, various modifications are possible without departing from the spirit or scope of a general inventive concept that is defined by the appended claim(s) and an equivalent(s) thereof.

REFERENCE SIGNS LIST

A to S substrate for mounting light-emitting element
T array substrate
1 substrate
1a front surface (of substrate)
1aa back surface (of substrate)
1b, 1c end surface (of substrate)
1d, 1e side surface (of substrate)
h, h1 height (from front surface of substrate)
3 base
3a top surface (sloping surface)
3aa mounting part
3b edge (on side of lower position part of base)
3L lower position part
3H higher position part
5 light-emitting element
5a light-emitting surface
7 base material
7a surface of base material
9 dam part
9a striking surface
9b groove part
9bb bottom part
9c wall surface
11 recessed part
11b, 11c inner wall (of recessed part)
15a first wall member
15b second wall member
21 positioning reference
21a upper bottom surface
$P_h$ light
Dp depth (of recessed part)
θ1, θ2, θ3, θ4 . . . angle

The invention claimed is:

1. A mounting substrate for mounting a light-emitting element, comprising:
  a substrate with a plate shape; and
  a base that protrudes from a front surface of the substrate, wherein
    the base has a mounting part for mounting a light-emitting element on a top surface of the base where the top surface composes a sloping surface that slopes with respect to the front surface,
    the substrate and the base are integrally formed of a ceramic, and
    the sloping surface of the base curves upward in a protruding shape, wherein
  the sloping surface has a lower position part having a lower height from the front surface and a higher position part having a higher height from the front surface, wherein a sidewall extends substantially perpendicularly from the front surface to an end part of the higher position part, and
  a gradient of the sloping surface on a side of the lower position part is greater than a gradient of the sloping surface on a side of the higher position part,
  wherein the light emitting element is disposed on the higher position part.

2. The mounting substrate for mounting a light-emitting element according to claim 1, wherein
  the substrate has two opposing end surfaces and a side surface at a right angle to each of the two opposing end surfaces, and
  a first wall member is provided on the front surface and along the side surface.

3. The mounting substrate for mounting a light-emitting element according to claim 2, wherein
  a second wall member is provided on the front surface and along one end surface of the two opposing end surfaces, and the first wall member and the second wall member are linked at one corner where the one end surface and the side surface intersect.

4. The mounting substrate for mounting a light-emitting element according to claim 3, wherein the plate shape of the substrate is a rectangular shape in a plan view, and a post member is provided on the front surface at another corner where none of the first wall member and the second wall member is provided.

5. The mounting substrate for mounting a light-emitting element according to claim 1, wherein the top surface of the base has a positioning reference, that is integrally formed with the base, for determining a mounting position of the light-emitting element, and the positioning reference is a circular cylinder or a prismatic column.

6. The mounting substrate for mounting a light-emitting element according to claim 5, wherein an upper bottom surface of the positioning reference is parallel to the front surface of the substrate.

7. The mounting substrate for mounting a light-emitting element according to claim 5, wherein the positioning reference includes a plurality of positioning references that are provided on the top surface and that are arranged in a direction from the higher position part to the lower position part, or in a perpendicular direction that is perpendicular to the direction.

8. The mounting substrate for mounting a light-emitting element according to claim 1, wherein the top surface of the base has a protruding and recessed shape.

9. An array substrate, wherein a plurality of the mounting substrates for mounting a light-emitting element according to claim 1 are joined.

10. A light-emitting device that has a light-emitting element on the mounting part of the mounting substrate for mounting a light-emitting element according to claim 1.

11. A light-emitting device that has a light-emitting element on each of the mounting parts of the array substrate according to claim 9.

12. The mounting substrate for mounting a light-emitting element according to claim 1, wherein the sloping surface slopes in a direction where a light-emitting surface of the light-emitting element is oriented.

* * * * *